United States Patent
Iuchi et al.

(10) Patent No.: US 10,062,657 B2
(45) Date of Patent: Aug. 28, 2018

(54) METHOD FOR MANUFACTURING ALLOY BUMP

(71) Applicant: ISHIHARA CHEMICAL CO., LTD., Hyogo (JP)

(72) Inventors: Shoya Iuchi, Hyogo (JP); Masaru Hatabe, Hyogo (JP)

(73) Assignee: ISHIHARA CHEMICAL CO., LTD., Hyogo (JP)

( * ) Notice: Subject to any disclaimer, the term of this patent is extended or adjusted under 35 U.S.C. 154(b) by 0 days.

(21) Appl. No.: 15/518,219

(22) PCT Filed: Oct. 9, 2015

(86) PCT No.: PCT/JP2015/078804
§ 371 (c)(1),
(2) Date: Jun. 14, 2017

(87) PCT Pub. No.: WO2016/056656
PCT Pub. Date: Apr. 14, 2016

(65) Prior Publication Data
US 2017/0330850 A1    Nov. 16, 2017

(30) Foreign Application Priority Data
Oct. 10, 2014    (JP) ................ 2014-209372

(51) Int. Cl.
*H01L 23/00* (2006.01)
*H05K 3/34* (2006.01)

(52) U.S. Cl.
CPC ............ *H01L 24/11* (2013.01); *H01L 24/13* (2013.01); *H05K 3/34* (2013.01);
(Continued)

(58) Field of Classification Search
CPC . H01L 2224/11462; H01L 2224/11848; H01L 2224/13109; H01L 2224/13111;
(Continued)

(56) References Cited

U.S. PATENT DOCUMENTS

| 6,638,847 B1 | 10/2003 | Cheung et al. |
| 2004/0180527 A1 | 9/2004 | Shimizu et al. |

(Continued)

FOREIGN PATENT DOCUMENTS

| EP | 2 405 469 A1 | 1/2012 |
| EP | 2 669 937 A1 | 12/2013 |

(Continued)

OTHER PUBLICATIONS

Japanese Office Action, dated Dec. 19, 2014, in Japanese Patent Application No. 2014-209372; 3 pages.
(Continued)

*Primary Examiner* — Monica D Harrison
(74) *Attorney, Agent, or Firm* — Knobbe, Martens Olson & Bear, LLP

(57) ABSTRACT

In order to manufacture an alloy bump, a resist pattern having openings which expose a substrate is formed on the substrate, an under-bump metal is formed on the substrate inside the openings, a first plating film is formed on the under-bump metal by electroplating, a second plating film containing no metal components which are contained in the first plating film is formed on the first plating film by electroplating, the resist pattern is removed, and the alloy bump is formed by heat treating the substrate to thereby alloy the first plating film and the second plating film.

3 Claims, 2 Drawing Sheets

(52) U.S. Cl.
CPC ............... *H01L 2224/11462* (2013.01); *H01L 2224/11848* (2013.01); *H01L 2224/13109* (2013.01); *H01L 2224/13111* (2013.01); *H01L 2224/13113* (2013.01)

(58) Field of Classification Search
CPC . H01L 2224/13113; H01L 24/11; H01L 24/13
USPC .......................................................... 438/613
See application file for complete search history.

(56) References Cited

U.S. PATENT DOCUMENTS

| | | |
|---|---|---|
| 2009/0218230 A1 | 9/2009 | Iijima |
| 2011/0095423 A1 | 4/2011 | Ohashi et al. |
| 2013/0043585 A1 | 2/2013 | Wakiyama et al. |
| 2013/0168851 A1 | 7/2013 | Lin et al. |
| 2013/0273730 A1* | 10/2013 | Huang ..................... C25D 5/10 438/613 |
| 2013/0309862 A1 | 11/2013 | Hatta et al. |

FOREIGN PATENT DOCUMENTS

| | | |
|---|---|---|
| JP | H09-186161 A | 7/1997 |
| JP | 2001-308129 A | 11/2001 |
| JP | 2002-043348 A | 2/2002 |
| JP | 2002-203868 A | 7/2002 |
| JP | 2004-281556 A | 10/2004 |
| JP | 2008-218483 A | 9/2008 |
| JP | 2010-040691 A | 2/2010 |
| JP | 2010-280955 A | 12/2010 |
| JP | 2012-153939 A | 8/2012 |
| JP | 2013-008829 A | 1/2013 |
| JP | 2013-042005 A | 2/2013 |
| WO | WO 2010/050185 A1 | 5/2010 |
| WO | WO 2016/056656 A1 | 4/2016 |

OTHER PUBLICATIONS

Japanese Office Action, dated May 27, 2015, in Japanese Patent Application No. 2014-209372; 2 pages.
Japanese Office Action, dated Aug. 18, 2016, in Japanese Patent Application No. 2014-209372; 8 pages.
International Search Report, dated Dec. 8, 2015, in International Application No. PCT/JP2015/078804; 4 pages.
Lee, S.F., et al. Effects of Stacking Sequence of Electrodeposited Sn and Bi Layers on Reflowed Sn-Bi Solder Alloys, 35$^{th}$ International Electronic Manufacturing Technology Conference, 2012.
Supplementary European Search Report and Opinion, dated Jun. 5, 2018, in European Application No. 15849378.3.

* cited by examiner

METHOD FOR MANUFACTURING ALLOY BUMP

CROSS REFERENCE TO RELATED APPLICATIONS

This application is the U.S. National Stage application under 35 U.S.C. § 371 of International Application No. PCT/JP2015/078804, filed Oct. 9, 2015, designating the U.S. and published as WO 2016/056656 A1 on Apr. 14, 2016, which claims the benefit of Japanese Patent Application No. JP 2014-209372, filed Oct. 10, 2014. Any and all applications for which a foreign or a domestic priority is claimed is/are identified in the Application Data Sheet filed herewith and is/are hereby incorporated by reference in their entirety under 37 C.F.R. § 1.57.

TECHNICAL FIELD

The present invention relates to a method for manufacturing an alloy bump. In particular, the present invention relates to a method for manufacturing an alloy bump, in which a plating method is employed.

BACKGROUND ART

Flip-chip mounting and the like are conventionally employed when electronic components and the like are mounted on a circuit substrate. During the flip-chip mounting, a bump is formed on the circuit substrate. In a method for forming the bump, for example, metal plating is performed, and electroplating is particularly performed.

For example, Patent Literature 1 discloses a method for forming a metal bump, in which electroplating is performed. In particular, in order to form the metal bump by electroplating, a resist pattern having openings is firstly formed on the circuit substrate. The metal bump comprising metal plating film(s) is subsequently formed on the circuit substrate inside the openings by electroplating. By using such a method, a height of a metal bump can be controlled depending on a thickness of a resist. For example, a metal bump having a high aspect ratio can be formed by increasing a thickness of a resist.

As a material for a metal bump, used are various metals such as lead (Pb), bismuth (Bi), zinc (Zn), copper (Cu), and silver (Ag), as well as tin (Sn). In recent years, an alloy of such metal components has been, in particular, frequently used as a material for a metal bump. For example, prepared is a plating solution containing two or more metals mentioned above, and then an alloy plating film is formed from the plating solution by electroplating. As a result, an alloy bump can be formed.

However, a problem has emerged due to recent miniaturization of electronic circuits. That is, during forming of an alloy bump having a high aspect ratio by increasing a thickness of a resist, one metal may be hard to deposit on the bottom of openings of the resist, on which the bump is to be formed, while the other metal may deposit in large quantity on the bottom. As a result, plating composition becomes to be unstable. In order to solve such problem, for example, a method for stabilizing metal composition of a Sn—Ag alloy bump is advanced in Patent Literature 2. In the method in Patent Literature 2, during forming of an alloy plating film from a Sn—Ag alloy plating solution by electroplating, acid concentration of the plating solution is monitored, and Ag concentration in the plating solution is adjusted based on the acid concentration. Thus the amount of deposited Ag can be maintained constant, and the metal composition of the alloy bump can be maintained constant.

CITATION LIST

Patent Literature

[Patent Literature 1] Japanese Laid-Open Patent Publication No. H09-186161
[Patent Literature 2] Japanese Laid-Open Patent Publication No. 2013-008829

SUMMARY OF THE INVENTION

As mentioned above, however, it is very difficult to control composition of an alloy plating solution. Although the composition of an alloy plating solution can be appropriately adjusted in accordance with the method in Patent Literature 2, continuous monitoring of acid concentration is needed, and the composition is hard to be delicately adjusted. Accordingly, a more convenient method for stabilizing composition of an alloy plating film is desired.

The present invention has been completed in view of the problem mentioned above. One object of the present invention is to enable more convenient control of composition of an alloy bump, so as to obtain a homogenous alloy bump with balanced composition.

In order to achieve the object mentioned above, in the present invention, after at least two plating films are laminated with each other by electroplating, these plating films are subjected to heat treatment to thereby alloy. As a result, an alloy bump is formed.

In particular, a method for manufacturing an alloy bump according to the present invention comprises:
 a step of forming a resist pattern on a substrate, the resist pattern having openings which expose the substrate;
 a step of forming an under-bump metal on the substrate inside the openings;
 a step of forming a first plating film on the under-bump metal by electroplating;
 a step of forming a second plating film on the first plating film by electroplating, the second plating film containing no metal components which are contained in the first plating film;
 a step of removing the resist pattern; and
 a step of forming the alloy bump by heat treating the substrate to thereby alloy the first plating film and the second plating film.

In the method for manufacturing an alloy bump according to the present invention, after the first plating film and the second plating film are laminated with each other, the alloy bump is formed by heat treating these plating films to thereby alloy. The types of metals constituting these plating films differ from each other. Accordingly, the alloy bump having desired composition and no variation in composition can be conveniently and stably obtained with no need for complicated steps. Also, composition of the alloy bump being conveniently obtained can be adjusted by adjusting each of film thicknesses of the first metal plating film and the second metal plating film. Furthermore, a temperature of heat treatment for alloying can be more lowered than each of melting points of single metals constituting the plating films by laminating the plating films with each other, each comprising the metals having lower melting point.

The method for manufacturing an alloy bump according to the present invention can further comprise a step of forming a third plating film on the second plating film by electroplating after forming of the second plating film.

Thus the alloy bump comprising a ternary alloy and having homogenous composition can be conveniently obtained by laminating three plating films with each other, each containing a single metal component.

In the method for manufacturing an alloy bump according to the present invention, the third plating film can be formed by using the same metal as the first plating film.

In this case, it is preferable to form the third plating film having a smaller film thickness than the first plating film and the second plating film.

Thus appearance easily turns into a shape having a smooth surface, so that after the heat treatment a homogenous bump can be formed having a smooth bump surface.

In the method for manufacturing an alloy bump according to the present invention, it is preferable that each of the first plating film, the second plating film, and the third plating film comprises any one of tin, bismuth, indium, zinc, silver, and an alloy thereof.

Thus can be applied a process being equivalent to a process for forming a plating film, which has been conventionally used in manufacture of a Sn bump, a Sn alloy bump, and the like. Accordingly, substitution can be easily carried out, and an alloy bump having a lower melting point can be obtained.

In the method for manufacturing an alloy bump according to the present invention, it is preferable that each of the first plating film, the second plating film, and the third plating film comprises a single metal.

Thus each plating film occurs itself no variation in composition because each plating film comprises a single metal. Accordingly, a finally obtained alloy bump having desired composition can be stable by adjusting a film thickness of each plating film.

In the method for manufacturing an alloy bump according to the present invention, it is preferable that the first plating film comprises Sn, and the second plating film comprises In or Bi.

Thus alloying starts on a contact surface of the first plating film with the second plating film at a lower temperature than a melting point of Sn and a melting point of In or Bi. Accordingly, a temperature of heat treatment can be lowered.

In the method for manufacturing an alloy bump according to the present invention, it is preferable that the first plating film comprises Sn, the second plating film comprises In, and the step of forming the alloy bump is performed by forming no further metal films on the second plating film.

In case that an In plating film is previously formed and then the In plating film is immersed in a Sn plating solution, Sn deposits on a surface of the In plating film in accordance with substitution reaction before starting of electroplating because Sn has electropositive potential than In. Although electroplating can be normally performed in such the case, adhesion of a film of Sn is low, which has deposited in accordance with the substitution reaction. As a result, the film of Sn may drop out during the following step of removing the resist. Accordingly, it is preferable that the In plating film is formed after the Sn plating film is firstly formed. Also, from such a reason, it is preferable that the In plating film is formed on the Sn plating film and then two plating films are melted to form the alloy bump without forming further Sn plating film on the In plating film. It is preferable from a viewpoint of simplification of the steps.

In the method for manufacturing an alloy bump according to the present invention, it is preferable that the first plating film comprises Sn, the second plating film comprises Bi, the third plating film comprises Sn, and the step of forming the alloy bump is performed by forming no further metal films on the third plating film.

In case that a plating film of Bi having higher melting point than Sn is formed as the undermost layer, melting of the Bi does not fully progress during heat treatment, so that homogeneity of composition of the alloy bump may be lowered due to unmelted residual. Accordingly, it is preferable that the first plating film is the Sn plating film. Also, a surface of a Bi plating film easily oxidizes. In case that the Bi plating film is formed as the uppermost layer, the surface of the Bi plating film oxidizes to give an oxidized layer, so that the oxidized layer may become to be unmelted residual during heat treatment. Accordingly, it is particularly preferable that the Sn plating film (third plating film) is laminated on the Bi plating film (second plating film). Furthermore, it is preferable that the alloy bump is formed by forming no further films on the third plating film from a viewpoint of simplification of the steps.

By the method for manufacturing an alloy bump according to the present invention, an alloy bump with desired and balanced composition can be conveniently and stably obtained without complicated steps.

DETAILED DESCRIPTION

Embodiments of the present invention will be described with reference to the drawings. The following description of preferred embodiments is essentially nothing more than an example. The following description does not intend to limit the present invention, application methods thereof, or uses thereof.

First Embodiment

Figure 1A:
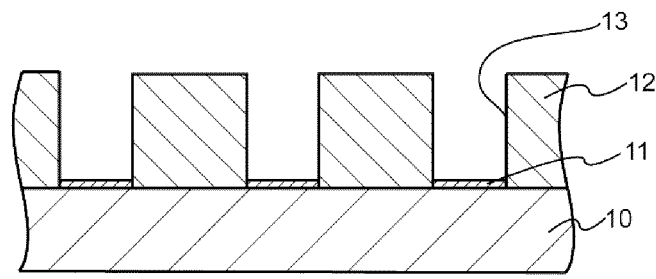
FIG. 1 (a)-FIG. 1 (d) are drawings showing the method for manufacturing an alloy bump in order step, according to First embodiment of the present invention.
Figure 1B:
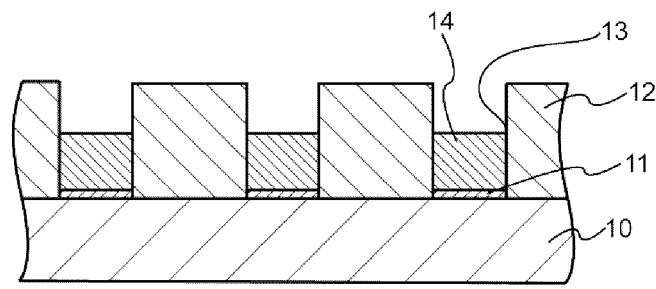
Figure 1C:
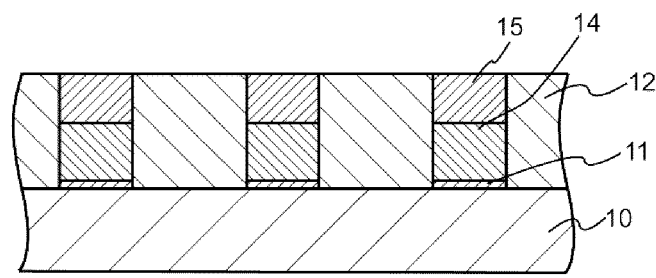
Figure 1D:
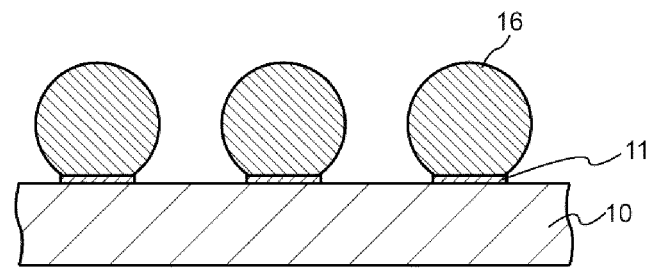

The method for manufacturing an alloy bump according to First embodiment of the present invention is firstly described with reference to FIG. 1 (a)-FIG. 1 (d). In the present embodiment described is a method for forming an alloy bump on a substrate, comprising an In—Sn alloy. The In—Sn alloy contains two types of metal components, i.e., tin (Sn) and Indium (In).

As shown in FIG. 1 (a), on a surface of a substrate 10 comprising, for example, a semiconductor and the like, in the usual manner formed is a resist film having a film thickness of about 70 μm so as to cover the surface of the substrate 10. Then a resist pattern 12 is formed, having openings 13 which expose the substrate 10. On the substrate 10 inside the openings 13 next formed is a plating film as a UBM 11, comprising, for example, nickel (Ni) and having a film thickness of about 3 μm. A material for forming the UBM 11 is naturally not limited to Ni. The material for forming the UBM 11 can be suitably selected in accordance with a material for forming an alloy bump which will be formed later on the UBM 11, and the like. The film thickness of the UBM can be suitably varied. The UBM 11 is not limited to the plating film, and may be a metal film which is formed by using another method such as a sputtering method.

In the present embodiment, the resist film is firstly formed so as to cover the substrate 10, and then the resist pattern 12 is formed by removing parts of the resist film. The parts are regions on which the UBM 11 will be formed later. The resist pattern 12 having the openings may be formed on the regions by using a printing method and the like, on which the UBM 11 will be formed later. A thickness of the resist pattern can be suitably decided in accordance with a height of an alloy bump which will be finally formed.

Then as shown in FIG. 1 (b), a Sn plating film (first plating film) 14 is formed on the UBM 11 inside the openings 13 by using a Sn plating solution by electroplating. The Sn plating solution used contains basically a soluble tin(II) salt, and an acid or a salt thereof as a liquid base, and contains, if necessary, various additives such as an oxidation inhibitor, a stabilizer, a complexing agent, a surfactant, a blighting agent, a smoothing agent, a pH adjusting agent, an electric conductive salt, and an antiseptic agent. As the soluble tin(II) salt, for example, can be used tin(II) borofluoride, tin(II) sulfate, tin(II) oxide, tin(II) chloride, sodium stannate, potassium stannate, and the like, as well as a tin(II) salt of an organic sulfonic acid such as methanesulfonic acid, ethanesulfonic acid, 2-propanolsulfonic acid, sulfosuccinic acid, or p-phenolsulfonic acid.

The oxidation inhibitor inhibits oxidization of $Sn^{2+}$ in a bath. As the oxidation inhibitor, for example, can be used hypophosphoric acid or a salt thereof, ascorbic acid or a salt thereof, hydroquinone, catechol, resorcinol, phloroglucinol, cresolsulfonic acid or a salt thereof, phenolsulfonic acid or a salt thereof, catecholsulfonic acid or a salt thereof, hydroquinonesulfonic acid or a salt thereof, hydrazine, and the like.

The stabilizer stabilizes a plating bath or inhibits decomposition of the plating bath. As the stabilizer, a well-known stabilizer can be used. For example can be used a cyanide compound; a sulfur-containing compound such as a thiourea, a thiosulfate, a sulfite, or acetylcysteine; an oxycarboxylic acid such as citric acid; and the like.

The complexing agent stabilizes $Sn^{2+}$ in neutral range, and inhibits occurrence of white precipitations and decomposition of the bath. As the complexing agent, for example, an oxycarboxylic acid, a polycarboxylic acid, a monocarboxylic acid, and the like can be used. Typically can be used gluconic acid, citric acid, glucoheptonic acid, gluconolactone, glucoheptalactone, formic acid, acetic acid, propionic acid, butyric acid, ascorbic acid, oxalic acid, malonic acid, succinic acid, glycolic acid, malic acid, tartaric acid, diglycolic acid, or each salt thereof. In particular, gluconic acid, citric acid, glucoheptonic acid, gluconolactone, glucoheptalactone, or each salt thereof is preferable. In addition can be used ethylenediamine, ethylenediaminetetraacetic acid (EDTA), diethylenetriaminepentaacetic acid (DTPA), nitrilotriacetic acid (NTA), iminodiacetic acid (IDA), iminodipropionic acid (IDP), hydroxyethyl ethylenediaminetriacetic acid (HEDTA), triethylenetetraminehexaacetic acid (TTHA), ethylenedioxybis(ethylamine)-N,N,N',N'-tetraacetic acid, glycine, nitrilotrimethylphosphonic acid, 1-hydroxyethane-1,1-diphosphonic acid, or each salt thereof.

The surfactant contributes to improve appearance, denseness, smoothness, adhesion, and the like of a plating film. Usual various surfactants such as a non-ionic surfactant, an anionic surfactant, an amphoteric surfactant, and a cationic surfactant can be used. As the anionic surfactant can be used an alkyl sulfate, a polyoxyethylenealkylether sulfate, a polyoxyethylenealkylphenylether sulfate, an alkylbenzene sulfonate, an alkylnaphthalene sulfonate, and the like. As the cationic surfactant can be exemplified a monoalkylamine salt, a dialkylamine salt, a trialkylamine salt, a dimethyl dialkylammonium salt, a trimethyl alkylammonium salt, and the like. As the non-ionic surfactant can be used a compound obtained by addition condensation of an alkanol having $C_1$ to $C_{20}$, phenol, naphthol, a bisphenol, an alkylphenol having $C_1$ to $C_{25}$, an arylalkylphenol, an alkylnaphthol having $C_1$ to $C_{25}$, an alkoxylphosphoric acid (salt) having $C_1$ to $C_{25}$, a sorbitan ester, a polyalkylene glycol, an aliphatic amide having $C_1$ to $C_{22}$, and the like, with 2 to 300 moles of ethylene oxide (EO) and/or propylene oxide (PO), and the like. As the amphoteric surfactant can be used a carboxybetaine, a sulfobetaine, an imidazolinebetaine, an aminocarboxylic acid, and the like.

As the blighting agent or a semi-blighting agent, for example, can be used various aldehydes such as benzaldehyde, o-chlorobenzaldehyde, 2,4,6-trichlorobenzaldehyde, m-chlorobenzaldehyde, p-nitrobenzaldehyde, p-hydroxybenzaldehyde, furfural, 1-naphthaldehyde, 2-naphthaldehyde, 2-hydroxy-1-naphthaldehyde, 3-acenaphthaldehyde, benzylideneacetone, pyridideneacetone, furfurylideneacetone, cinnamaldehyde, anisaldehyde, salicylaldehyde, crotonaldehyde, acrolein, glutaraldehyde, paraldehyde, and vanillin; triazine; imidazole; indole; quinoline; 2-vinylpyridine; aniline; phenanthroline; neocuproine; picolinic acid; a thiourea; N-(3-hydroxybutylidene)-p-sulfanilic acid; N-butylidenesulfanilic acid; N-cinnamoylidenesulfanilic acid; 2,4-diamino-6-(2'-methylimidazolyl(1'))ethyl-1,3,5-triazine; 2,4-diamino-6-(2'-ethyl-4-methylimidazolyl(1'))ethyl-1,3,5-triazine; 2,4-diamino-6-(2'-undecylimidazolyl(1'))ethyl-1,3,5-triazine; phenyl salicylate; benzothiazoles such as benzothiazole, 2-methylbenzothiazole, 2-mercaptobenzothiazole, 2-aminobenzothiazole, 2-amino-6-methoxybenzothiazole, 2-methyl-5-chlorobenzothiazole, 2-hydroxybenzothiazole, 2-amino-6-methylbenzothiazole, 2-chlorobenzothiazole, 2,5-dimethylbenzothiazole, and 5-hydroxy-2-methylbenzothiazole; or the like.

Examples of the smoothing agent overlap those of the blighting agent and the like. As the smoothing agent can be used β-naphthol, β-naphthol-6-sulfonic acid, β-naphthalenesulfonic acid, m-chlorobenzaldehyde, p-nitrobenzaldehyde, p-hydroxybenzaldehyde, o-methoxybenzaldehyde, p-methoxybenzaldehyde, vanillin, 2,4-dichlorobenzaldehyde, 2,6-dichlorobenzaldehyde, o-chlorobenzaldehyde, p-chlorobenzaldehyde, 1-naphthaldehyde, 2-naphthaldehyde, 2(4)-hydroxy-1-naphthaldehyde, 2(4)-chloro-1-naphthaldehyde, 2(3)-thiophenecarboxaldehyde, 2(3)-furaldehyde, 3-indolecarboxaldehyde, salicylaldehyde, o-phthalaldehyde, formaldehyde, acetaldehyde, paraldehyde, butylaldehyde, isobutylaldehyde, propionaldehyde, n-valeraldehyde, acrolein, crotonaldehyde, glyoxal, aldol, succindialdehyde, caproaldehyde, isovaleraldehyde, allylaldehyde, glutaraldehyde, 1-benzylidene-7-heptanal, 2,4-hexadienal, cinnamaldehyde, benzylcrotonaldehyde, a condensate of an amine with an aldehyde, mesityl oxide, isophorone, diacetyl, 3,4-hexanedione, acetylacetone, 3-chlorobenzylideneacetone, sub.pyridylideneacetone, sub.furfurylideneacetone, sub.thenylideneacetone, 4-(1-naphthyl)-3-butene-2-one, 4-(2-furyl)-3-butene-2-one, 4-(2-thiophenyl)-3-butene-2-one, curcumin, benzylideneacetylacetone, benzalacetone, acetophenone, 2,4-dichloroacetophenone, 3,4-dichloroacetophenone, benzylideneacetophenone, 2-cinnamylthiophene, 2-(ω-benzoyl)vinylfuran, vinylphenylketone, acrylic acid, methacrylic acid, ethacrylic acid, ethyl acrylate, methyl methacrylate, butyl methacrylate, crotonic acid, propylene-1,3-dicarboxylic acid, cinnamic acid, o-toluidine, m-toluidine, p-toluidine, o-aminoaniline, p-aminoaniline, aniline, o-chloroaniline, p-chloroaniline, 2,5-chloromethylaniline, 3,4-chloromethylaniline, N-monomethylaniline, 4,4'-diaminodiphenylmethane, N-phenyl-α-naphthylamine, N-phenyl-β-naphthylamine, methylbenztriazole, 1,2,3-triazine, 1,2,4-triazine, 1,3,5-triazine, 1,2,3-benztriazine, imidazole, 2-vinylpyridine, indole, quinoline, a reactant of monoethanolamine with o-vanillin, polyvinyl alcohol, catechol, hydroquinone, resorcinol, polyethyleneimine, ethylenediaminetetraacetic acid disodium salt, polyvinylpyrrolidone, and the like. In addition, as the smoothing agent are effective gelatin, polypeptone, N-(3-hydroxybutylidene)-p-sulfanilic acid, N-butylidenesulfanilic acid, N-cinnamoylidenesulfanilic acid, 2,4-diamino-6-(2'-methylimidazolyl(1'))ethyl-1,3,5-triazine, 2,4-diamino-6-(2'-ethyl-4-methylimidazolyl(1'))ethyl-1,3,5-triazine, 2,4-diamino-6-(2'-undecylimidazolyl(1'))ethyl-1,3,5-triazine, phenyl salicylate, or benzothiazoles. As the benzothiazoles can be used benzothiazole, 2-methylbenzothiazole, 2-mercaptobenzothiazole, 2-(methylmercapto)benzothiazole, 2-aminobenzothiazole, 2-amino-6-methoxybenzothiazole, 2-methyl-5-chlorobenzothiazole, 2-hydroxybenzothiazole, 2-amino-6-methylbenzothiazole, 2-chlorobenzothiazole, 2,5-dimethylbenzothiazole, 6-nitro-2-mercaptobenzothiazole, 5-hydroxy-2-methylbenzothiazole, 2-benzothiazole thioacetic acid, and the like.

As the pH adjusting agent can be used various acids such as hydrochloric acid and sulfuric acid; various bases such as ammonia solution, potassium hydroxide, and sodium hydroxide; and the like. In addition can be used monocarboxylic acids such as formic acid, acetic acid, and propionic acid; boric acids; phosphoric acids; dicarboxylic acids such as oxalic acid and succinic acid; oxycarboxylic acids such as lactic acid and tartaric acid As the electric conductive salt can be used sodium salts of various acids such as sulfuric acid, hydrochloric acid, phosphoric acid, sulfamic acid, and sulfonic acid; potassium salts of the various acids; magnesium salts of the various acids; ammonium salts of the various acids; amine salts of the various acids; and the like. Some compound among the above exemplified pH adjusting agents can serve as the electric conductive salt.

As the antiseptic agent can be used boric acid, 5-chloro-2-methyl-4-isothiazoline-3-one, benzalkonium chloride, phenol, phenol polyethoxylate, thymol, resorcinol, isopropylamine, guaiacol, and the like.

In the present embodiment, Sn plating solution contains tin(II) methanesulfonate in an amount of 50 g/L as tin, 100 g/L of methanesulfonic acid, 3 g/L of catechol, and 10 g/L of Bisphenol A polyethoxylate (EO: 13 moles). By using the Sn plating solution, electroplating is performed under a condition of 3 A/dm$^2$ and 30° C. to form the Sn plating film 14 having a film thickness of 32 µm.

Then as shown in FIG. 1 (c), an In plating film (second plating film) 15 is formed on the Sn plating film 14 by using an In plating solution by electroplating. The In plating solution used contains basically a soluble indium salt as an essential component, and an acid or a salt thereof as a bath base, and contains, if necessary, various additives such as an oxidation inhibitor, a stabilizer, a complexing agent, a surfactant, a blighting agent, a smoothing agent, a pH adjusting agent, an electric conductive salt, and an antiseptic agent. As the soluble indium salt, for example, can be used indium chloride, indium sulfate, indium oxide, an indium salt of an organic sulfonic acid, and the like. In the present embodiment, In plating solution contains indium chloride in an amount of 60 g/L as indium, 200 g/L of methanesulfonic acid, 75 g/L of glycine, 1 g/L of polyvinylpyrrolidone, and 1 g/L of cystamine. By using the In plating solution at pH 2, electroplating is performed under a condition of 2 A/dm$^2$ and 30° C. to form the In plating film 15 having a film thickness of 35 µm.

Then as shown in FIG. 1 (d), the resist pattern 12 is removed by, for example, etching, and the substrate 10 is subjected to heat treatment at 200° C. of a peak temperature for 3 minutes. The Sn plating film 14 and the In plating film 15 are melted to form an approximately spherical alloy bump 16 comprising alloy of Sn and In, in which the mass ratio of Sn to In, i.e., Sn/In, is 48/52. Conditions of the heat treatment are not particularly limited to the above, and can be appropriately adjusted as long as the Sn plating film 14 and the In plating film 15 can be melted.

As described above, in the method for manufacturing an alloy bump according to the present embodiment, after forming of two plating films laminated with each other, each comprising metal materials which constitute an alloy bump, these films are melted by heat treatment to form the alloy bump. The alloy bump can be formed by such a considerably convenient method. In addition, the obtained alloy bump has homogenous composition of metal components. In case that the Sn plating film and the In plating film are laminated with each other, and are melted to form the alloy bump, as in the present embodiment, a treatment temperature for melting can be more lowered than each of melting points of single metals used for the plating films. The present embodiment is advantageous because melting at lower temperature can be performed.

In case that the Sn plating film and the In plating film are laminated with each other, it is preferable that the Sn plating film is formed as an under layer and then the In plating film is formed as an upper layer, as the present embodiment. In case that the In plating film is previously formed and then the In plating film is immersed in the Sn plating solution, Sn deposits on a surface of the In plating film in accordance with substitution reaction before starting of electroplating because Sn has electropositive potential than In. Although electroplating can be normally performed in such the case, adhesion of a film of Sn is low, which has deposited in accordance with the substitution reaction. As a result, the film of Sn may drop out during the following step of removing the resist. Accordingly, it is preferable that the In plating film is formed after the Sn plating film is firstly formed.

Also, from such a reason mentioned above, it is preferable that the In plating film is formed on the Sn plating film and then two plating films are melted to form the alloy bump without forming further Sn plating film on the In plating film. It is preferable from a viewpoint of simplification of the steps.

Second Embodiment

Figure 2A:
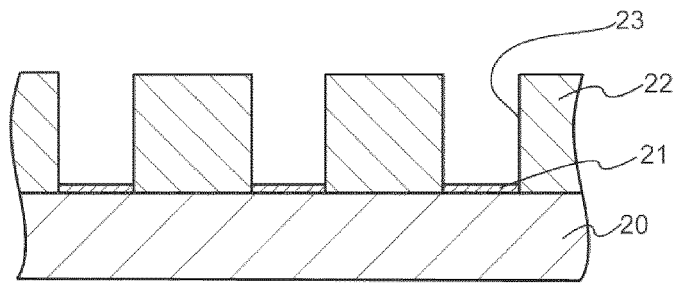
FIG. 2 (a)-FIG. 2 (e) are drawings showing the method for manufacturing an alloy bump in order step, according to Second embodiment of the present invention.
Figure 2B:
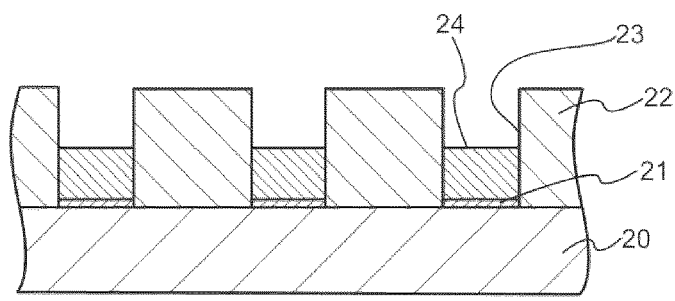
Figure 2C:
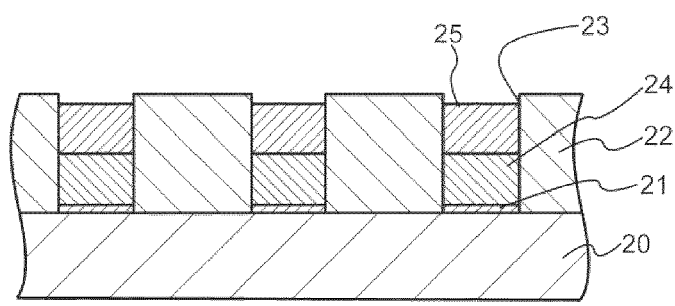
Figure 2D:
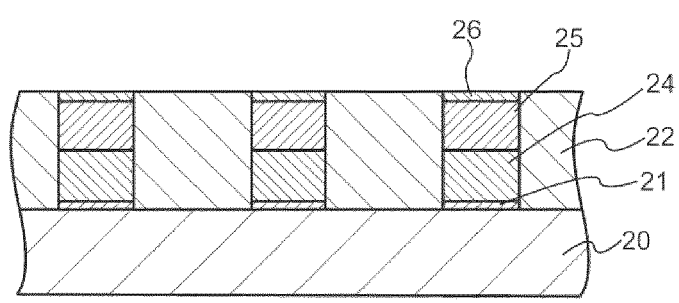
Figure 2E:
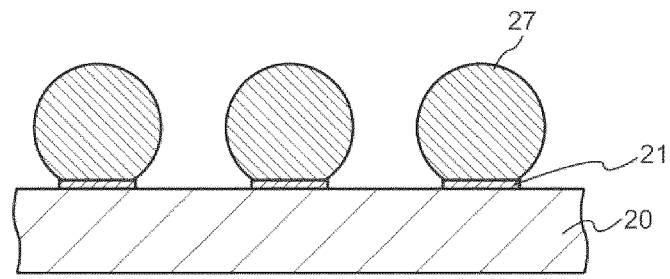

A method for forming an alloy bump by forming three plating films is described with reference to FIG. 2 (a)-FIG. 2 (e), as Second embodiment of the present invention. In the present embodiment, the method for forming an alloy bump comprising a Bi—Sn alloy is described.

As shown in FIG. 2 (a), on a substrate 20 firstly formed is a resist pattern 22 having openings 23 which expose the substrate 20, as with First embodiment mentioned above. Then a UBM 21 is formed on the substrate 20 inside the openings 23.

Then as shown in FIG. 2 (b), a Sn plating film 24 is formed as a first plating film by using a Sn plating solution. The Sn plating solution contains, as with First embodiment, a soluble tin(II) salt as an essential component, and an acid or a salt thereof as a liquid base, and can contain, if necessary, various additives such as an oxidation inhibitor, a stabilizer, a complexing agent, a surfactant, a blighting agent, a smoothing agent, a pH adjusting agent, an electric conductive salt, and an antiseptic agent. In the present embodiment, Sn plating solution contains tin(II) methanesulfonate in an amount of 50 g/L as tin, 100 g/L of methanesulfonic acid, 1.0 g/L of potassium hydroquinonesulfonate, 3 g/L of sodium alkylnaphthalenesulfonate, 5 g/L of 5, 5'-dithiobis(1-phenyl-1H-tetrazole), and 10 g/L of Bisphenol F polyethoxylate (EO: 15 moles). By using the Sn plating solution, electroplating is performed under a condition of 3 $A/dm^2$ and 30° C. to form the Sn plating film 24 having a film thickness of 30.8 µm.

Then as shown in FIG. 2 (c), a Bi plating film (second plating film) 25 is formed on the Sn plating film 24 by using a Bi plating solution by electroplating. The Bi plating solution used contains basically a soluble bismuth salt as an essential component, and, as with the Sn plating solution mentioned above, an acid or a salt thereof as a bath base, and contains, as with the Sn plating solution, if necessary, various additives such as an oxidation inhibitor, a stabilizer, a complexing agent, a surfactant, a blighting agent, a smoothing agent, a pH adjusting agent, an electric conductive salt, and an antiseptic agent. As the soluble bismuth salt, for example, can be used bismuth sulfate, bismuth oxide, bismuth chloride, bismuth bromide, bismuth nitrate, a bismuth salt of an organic sulfonic acid, a bismuth salt of a sulfosuccinic acid, and the like. In the present embodiment, Bi plating solution contains bismuth methanesulfonate in an amount of 50 g/L as bismuth, 100 g/L of methanesulfonic acid, 10 g/L of Bisphenol A polyethoxylate (EO: 13 moles), and 0.5 g/L of benzyldimethyltetradecylammonium hydroxide. By using the Bi plating solution, electroplating is performed under a condition of 2 $A/dm^2$ and 30° C. to form the Bi plating film 25 having a film thickness of 34.2 µm.

Then as shown in FIG. 2 (d), on the Bi plating film 25 formed is a Sn plating film 26 as a third plating film by using the same Sn plating solution as used for forming the first plating film. In the present embodiment, Sn plating solution contains tin(II) methanesulfonate in an amount of 50 g/L as tin, 100 g/L of methanesulfonic acid, 1.0 g/L of potassium hydroquinonesulfonate, 3 g/L of sodium alkylnaphthalenesulfonate, 5 g/L of 5, 5'-dithiobis(1-phenyl-1H-tetrazole), and 10 g/L of Bisphenol F polyethoxylate (EO: 15 moles). By using the Sn plating solution, electroplating is performed under a condition of 1 $A/dm^2$ and 30° C. to form the Sn plating film 26 having a film thickness of 2.0 µm. That is, the Sn plating film 26 as the third plating film can be formed, having a smaller film thickness than the Sn plating film as the first plating film and the Bi plating film as the second plating film. Thus it is possible to provide a smooth surface appearance.

Then as shown in FIG. 2 (e), the resist pattern 22 is removed, and the substrate 20 is subjected to heat treatment at 260° C. of a peak temperature for 3 minutes. The Sn plating film (first plating film) 24, the Bi plating film (second plating film) 25, and the Sn plating film (third plating film) 26 are melted to form an approximately spherical alloy bump 27 comprising alloy of Bi and Sn, in which the mass ratio of Bi to Sn, i.e., Bi/Sn, is 58/42. Conditions of the heat treatment are not particularly limited to the above, and can be appropriately adjusted as long as each of the plating films can be melted.

In the method for manufacturing an alloy bump according to Second embodiment, after forming of three plating films laminated with each other, each comprising metal materials which constitute an alloy bump, these films are melted by heat treatment to form the alloy bump. The alloy bump can be formed by such a considerably convenient method. In addition, the obtained alloy bump has homogenous composition of metal components.

In the present embodiment, employed is a step of laminating the Sn plating film (first plating film), the Bi plating film (second plating film), and the Sn plating film (third plating film) with each other in order, as a method for forming a bump comprising a Bi—Sn alloy. The bump comprising a Bi—Sn alloy may be manufactured by laminating the Sn plating film (first plating film) and the Bi plating film (second plating film) with each other, as with First embodiment, i.e., without forming further plating films. In case that no further plating films are formed, it is preferable that the Sn plating film and the Bi plating film are laminated with each other in order. In case that a plating film of Bi having higher melting point than Sn is formed as the undermost layer, melting of the Bi does not fully progress during heat treatment, so that homogeneity of composition of the alloy bump may be lowered due to unmelted residual. Accordingly, it is preferable that the first plating film is the Sn plating film.

Also, a surface of a Bi plating film easily oxidizes. In case that the Bi plating film is formed as the uppermost layer, the surface of the Bi plating film oxidizes to give an oxidized layer, so that the oxidized layer may become to be unmelted residual during heat treatment. Accordingly, it is particularly preferable that the Sn plating film (first plating film), the Bi plating film (second plating film), and the Sn plating film (third plating film) are laminated with each other in order, as with Second embodiment mentioned above.

The alloy bump comprising an In—Sn binary alloy is formed in First embodiment, and the alloy bump comprising a Bi—Sn binary alloy is formed in Second embodiment. It is possible to form a ternary alloy bump comprising three types of metal components, and an alloy bump comprising more than three types of metal components. For example, in case that an alloy bump is manufactured by using a ternary alloy, after three plating films each comprising a different single metal component are laminated with each other, these three plating films are melted by heat treatment to give the alloy bump comprising a ternary alloy. These three plating films are, for example, a Bi plating film, a Sn plating film, and an In plating film. In addition, after a plating film comprising a single metal component and a binary alloy plating film are laminated with each other, these two plating films are melted by heat treatment to give the alloy bump comprising a ternary alloy. These two plating films are, for example, an In plating film and a Bi—Sn alloy plating film. In embodiments mentioned above, Sn, Bi, and In are used as a metal component. The metal component is not limited to these, and metals such as zinc (Zn) and silver (Ag) can be used.

EXAMPLES

The method for manufacturing an alloy bump according to the present invention is described in detail by the following examples.

In the examples, each alloy bump was formed by the method for manufacturing an alloy bump according to the present invention, or a conventional method in which an alloy plating solution containing plural metal component was used without laminating plating films. Homogeneity of composition of each alloy bump was examined, and the alloy bump of the present invention was compared with the conventional alloy bump.

In particular, in Examples 1 to 5, 15, and 17, a Bi—Sn alloy bump was formed under the same conditions, other than the film thickness, as with Sn plating conditions and Bi plating conditions, which were shown in Second embodiment according to the present invention. The following Table 1 shows the film thickness of each plating film and laminating order of the plating films.

In Examples 6 to 9, 14, and 18, an In—Sn alloy bump was formed under the same conditions, other than the film thickness, as with In plating conditions and Sn plating conditions, which were shown in First embodiment according to the present invention. In Examples 10, 11, and 16, an In—Bi alloy bump was formed under the same conditions, other than the film thickness, as with In plating conditions shown in First embodiment according to the present invention and Bi plating conditions shown in Second embodiment according to the present invention. The following Table 1 shows the film thickness of each plating film and laminating order of the plating films.

In Examples 12 and 13, a Bi—Sn—Ag alloy bump was formed. In particular, in Example 12, a Bi plating film was formed under the same conditions, other than the film thickness, as with Bi plating conditions shown in Second embodiment according to the present invention. Then on the Bi plating film formed was a Sn—Ag alloy plating film having a film thickness of 33.1 μm by electroplating under a condition of 3 A/dm$^2$ and 25° C. For forming the Sn—Ag alloy plating film used was a Sn—Ag alloy plating solution containing tin(II) methanesulfonate in an amount of 50 g/L as tin, silver methanesulfonate in an amount of 0.5 g/L as silver, 120 g/L of methanesulfonic acid, 120 g/L of thiobis (diethylene diglycol), 10 g/L of Bisphenol A ethoxylate (EO: 15 moles), and 2.0 g/L of catechol. Then these plating films were melted to form the alloy bump. In Example 13, a Bi plating film and a Sn plating film were formed in order under the same conditions, other than the film thickness, as with Bi plating conditions and Sn plating conditions, which were shown in Second embodiment according to the present invention. Then on the Sn plating film formed was an Ag plating film having a film thickness of 0.2 μm by electroplating under a condition of 2 A/dm$^2$ and 30° C. For forming the Ag plating film used was an Ag plating solution containing silver thiosulfate in an amount of 20 g/L as silver, 450 g/L of sodium thiosulfate, 20 g/L of sodium metabisulfite, and 1 g/L of PEG4000. On the Ag plating film formed was a Sn plating film under the same conditions, other than the film thickness, as with Sn plating conditions shown in Second embodiment according to the present invention. Then these plating films were melted to form the alloy bump. The following Table 1 shows the film thickness of each plating film.

In Comparative Examples, an alloy plating film being one layer was formed by the conventional method in which an alloy plating solution was used, and then the alloy plating film was melted to form an alloy bump. In particular, in Comparative Example 1 formed was a Bi—Sn alloy plating film having a film thickness of 70 μm by electroplating under a condition of 2 A/dm$^2$ and 25° C. For forming the Bi—Sn alloy plating film used was a Bi—Sn alloy plating solution containing tin(II) methanesulfonate in an amount of 15 g/L as tin, bismuth methanesulfonate in an amount of 40 g/L as bismuth, 100 g/L of methanesulfonic acid, 4.5 g/L of disodium 3,3'-dithiobis-propanesulfonate, 5 g/L of styrenated polyethoxylate (EO: 10 moles), and 3.0 g/L of hydroquinone. Then heat treatment was performed at 260° C. of a peak temperature for 3 minutes, and the Bi—Sn alloy plating film was melted to form an approximately spherical alloy bump comprising alloy of Sn and Bi, in which the mass ratio of Sn to Bi, i.e., Sn/Bi, is 42/58. In Comparative Examples 2 and 3 formed was an In—Sn alloy plating film having a film thickness of 70 μm by electroplating under a condition of 1.5 A/dm$^2$ and 30° C. For forming the In—Sn alloy plating film used was an In—Sn alloy plating solution containing tin(II) sulfamate in an amount of 50 g/L as tin, indium sulfamate in an amount of 10 g/L as indium, 150 g/L of sulfamic acid, 10 g/L of imidazole, 10 g/L of Bisphenol A polyethoxylate (EO: 15 moles), 2 g/L of benzyltributylammonium hydroxide, 1 g/L of polyethyleneimine, and 0.5 g/L of catechol. Then heat treatment was performed at 160° C. of a peak temperature for 3 minutes, and the In—Sn alloy plating film was melted to form an approximately spherical alloy bump comprising alloy of In and Sn. The mass ratio of In to Sn, i.e., In/Sn, is 52/48 in Comparative Example 2, or 65/35 in Comparative Example 3.

Each of the alloy bumps in Examples and Comparative Examples was subjected to composition analysis by using Energy-dispersive X-ray Spectroscopy (EDX).

For each of Examples and Comparative Examples, the following Table 1 shows the UBM, the film thickness and the composition of each plating film, the ratio in metals constituting alloy, and the difference in the ratio in metals constituting alloy. The difference was calculated in accordance with the following method.

(Method for Calculating Difference in Ratio in Metals Constituting Alloy)

Random ten parts were selected in the alloy bump, and at each part measured was the ratio in metals constituting alloy by using the EDX to obtain ten values each corresponding to the content (% by weight) of one metal in the alloy. Among ten values of the content selected were the upper limit and the lower limit, and the difference (% by weight) was calculated by subtracting the lower limit from the upper limit.

TABLE 1

<Examples>

| Ex. | UBM | First Layer | Second Layer | Third Layer | Fourth layer | Total film thickness | Ratio in metals constituting alloy | Difference in ratio |
|---|---|---|---|---|---|---|---|---|
| 1 | Ni 3 μm | Sn 32.8 μm | Bi 34.2 μm | | | 70 μm | 58Bi—42Sn | 5.4% |
| 2 | Ni 3 μm | Sn 16.4 μm | Bi 34.2 μm | Sn 16.4 μm | | 70 μm | 58Bi—42Sn | 4.2% |
| 3 | Ni 3 μm | Sn 30.8 μm | Bi 34.2 μm | Sn 2.0 μm | | 70 μm | 58Bi—42Sn | 3.7% |
| 4 | Ni 3 μm | Bi 22.4 μm | Sn 44.6 μm | | | 70 μm | 40Bi—60Sn | 4.8% |

TABLE 1-continued

| | | | | | | | | |
|---|---|---|---|---|---|---|---|---|
| 5 | Ni 3 μm | Sn 22.3 μm | Bi 22.3 μm | Sn 22.3 μm | Bi 22.3 μm | 70 μm | 40Bi—60Sn | 7.3% |
| 6 | Ni 3 μm | Sn 32 μm | In 35 μm | | | 70 μm | 52In—48Sn | 6.4% |
| 7 | Ni 3 μm | In 35 μm | Sn 32 μm | | | 70 μm | 52In—48Sn | 3.9% |
| 8 | Ni 3 μm | Sn 11.7 μm | In 43.7 μm | Sn 11.6 μm | | 70 μm | 65In—35Sn | 5.9% |
| 9 | Ni 3 μm | Sn 11.7 μm | In 21.9 μm | Sn 11.6 μm | In 21.8 μm | 70 μm | 65In—35Sn | 7.9% |
| 10 | Ni 3 μm | In 59.2 μm | Bi 7.8 μm | | | 70 μm | 85In—15Bi | 6.2% |
| 11 | Ni 3 μm | In 29.6 μm | Bi 7.8 μm | In 29.6 μm | | 70 μm | 85In—15Bi | 6.4% |
| 12 | Ni 3 μm | Bi 33.9 μm | Sn 0.8 μm-Ag 33.1 μm | | | 70 μm | 57.6Bi—42Sn—0.4Ag | 8.9%(for Bi) |
| 13 | Ni 3 μm | Bi 33.9 μm | Sn 16.5 μm | Ag 0.2 μm | Sn 16.4 μm | 70 μm | 57.6Bi—42Sn—0.4Ag | 4.7%(for Bi) |
| 14 | Ni 3 μm | Sn 8.1 μm | In 8.9 μm | | | 20 μm | 52In—48Sn | 8.3% |
| 15 | Ni 3 μm | Sn 7.3 μm | Bi 8.7 μm | Sn 1.0 μm | | 20 μm | 58Bi—42Sn | 7.8% |
| 16 | Ni 3 μm | In 15.0 μm | Bi 2.0 μm | | | 20 μm | 85In—15Bi | 5.5% |
| 17 | Cu 30 μm | Sn 18.6 μm | Bi 20.4 μm | Sn 1.0 μm | | 70 μm | 58Bi—42Sn | 8.1% |
| 18 | Cu 30 μm | Sn 7.0 μm | In 26.1 μm | Sn 6.9 μm | | 70 μm | 65In—35Sn | 8.4% |
| 19 | Ni 3 μm | Sn 3.9 μm | Bi 5.1 μm | Sn 1.0 μm | | 10 μm | 58Bi—42Sn | 6.6% |

<Comparative Examples>

| Com. Ex. | UBM | First layer | Second layer | Third layer | Fourth layer | Total film thickness | Ratio in metals constituting alloy | Difference in ratio |
|---|---|---|---|---|---|---|---|---|
| 1 | Ni 3 μm | Bi—Sn 70 μm | | | | 70 μm | 58Bi—42Sn | 12.6% |
| 2 | Ni 3 μm | In—Sn 70 μm | | | | 70 μm | 52In—48Sn | 21.2% |
| 3 | Ni 3 μm | In—Sn 70 μm | | | | 70 μm | 65In—35Sn | 16.8% |

As shown on Table 1, it can be understood that each of the alloy bumps in Examples 1 to 19, which was formed by the method for manufacturing an alloy bump according to the present invention, shows small difference in the ratio in metals constituting alloy and has homogenous composition, in comparison to each of the alloy bumps in Comparative Examples 1 to 3, which was formed by the conventional method. As shown in Examples 12 and 13, by the method for manufacturing an alloy bump according to the present invention can be formed a ternary alloy bump having homogenous composition, as well as a binary alloy bump. As shown in Examples 2, 3, 5, 8, 9, 11, 13, 15, 17, 18, and 19, plating films formed for manufacturing an alloy bump are not limited to be two layers. By forming three or more layers of plating films can be formed an alloy bump having homogenous composition.

In order to analyze in detail homogeneity of composition of each of the alloy bumps which were formed by the method for manufacturing an alloy bump according to the present invention, to comparative review subjected was the composition ratio in metal components in an under layer region, a middle layer region, and an upper layer region of each alloy bump, based on analysis by using the EDX.

By the method for manufacturing an alloy bump according to the present invention, on a UBM comprising Ni formed was a Sn plating film having a film thickness of 13.9 μm by electroplating under a condition of 3 A/dm$^2$ and 30° C., and then on the Sn plating film formed was an In plating film having a film thickness of 26.1 μm by electroplating under a condition of 3 A/dm$^2$ and 30° C. For forming the Sn plating film used was a Sn plating solution containing tin(II) methanesulfonate in an amount of 50 g/L as tin, 100 g/L of methanesulfonic acid, 1.0 g/L of sulfocatechol, and 10 g/L of Bisphenol F polyethoxylate (EO: 15 moles). For forming the In plating film used was an In plating solution containing indium sulfate in an amount of 40 g/L as indium, 50 g/L of sulfuric acid, 5 g/L of aluminum sulfate, and 1 g/L of PEG20000. Then these plating films were melted to form an In—Sn alloy bump. The In—Sn alloy bump was analyzed by using the EDX. In particular, the alloy bump was subjected to EDX mapping, and then measured was the composition ratio of In to Sn in each of the under layer region, the middle layer region, and the upper layer region, which were equally divided three regions in the bump. The following Table 2 shows the results.

TABLE 2

| Region | In | Sn |
|---|---|---|
| Upper layer region | 62.5% by mass | 37.5% by mass |
| Middle layer region | 62.3% by mass | 37.7% by mass |
| Under layer region | 63.3% by mass | 36.7% by mass |
| All region | 63.1% by mass | 36.9% by mass |

On a UBM comprising Ni formed was a Sn plating film having a film thickness of 17.6 μm by electroplating under a condition of 3 A/dm$^2$ and 30° C., and then on the Sn plating film formed was a Bi plating film having a film thickness of 20.4 μm by electroplating under a condition of 2 A/dm$^2$ and 30° C., and then on the Bi plating film formed was a Sn plating film having a film thickness of 2 μm by electroplating under a condition of 1 A/dm$^2$ and 30° C. For firstly forming the Sn plating film used was a Sn plating solution containing tin(II) methanesulfonate in an amount of 50 g/L as tin, 100 g/L of methanesulfonic acid, 1.0 g/L of potassium hydroquinonesulfonate, 0.5 g/L of benzyltributylammonium hydroxide, and 10 g/L of cumylphenol polyethoxylate (EO: 20 moles). For forming the Bi plating film used was a Bi plating solution containing bismuth methanesulfonate in an amount of 50 g/L as bismuth, 100 g/L of methanesulfonic acid, 8.0 g/L of PEG20000, and 1.0 g/L of 5-mercapto-1-methylimidazole. For lastly forming the Sn plating film used was a Sn plating solution containing tin(II) methanesulfonate in an amount of 50 g/L as tin, 100 g/L of methanesulfonic acid, 1.0 g/L of potassium hydroquinonesulfonate, 0.5 g/L of benzyltributylammonium hydroxide, and 10 g/L of cumylphenol polyethoxylate (EO: 20 moles). Then these plating films were melted to form a Bi—Sn alloy bump. The Bi—Sn alloy bump was analyzed by using the EDX. In particular, the alloy bump was subjected to EDX mapping, and then the ratio of Bi to Sn in the composition was measured in each of the under layer region, the middle layer region, and the upper layer region, which were equally divided three regions in the bump. The following Table 3 shows the results.

TABLE 3

| Region | Sn | Bi |
| --- | --- | --- |
| Upper layer region | 43.1% by mass | 56.9% by mass |
| Middle layer region | 41.7% by mass | 58.3% by mass |
| Under layer region | 43.2% by mass | 56.8% by mass |
| All region | 42.8% by mass | 57.2% by mass |

On a UBM comprising Ni formed was an In plating film having a film thickness of 32.3 μm by electroplating under a condition of 3 A/dm² and 30° C., and then on the In plating film formed was a Bi plating film having a film thickness of 4.7 μm by electroplating under a condition of 2 A/dm² and 30° C., and then on the Bi plating film formed was an In plating film having a film thickness of 3 μm by electroplating under a condition of 3 A/dm² and 30° C. For firstly forming the In plating film used was an In plating solution containing indium sulfamate in an amount of 50 g/L as indium, 50 g/L of sulfamic acid, 100 g/L of sodium sulfamate, 10 g/L of sodium chloride, and 3 g/L of triethanolamine. For forming the Bi plating film used was a Bi plating solution containing bismuth methanesulfonate in an amount of 50 g/L as bismuth, 100 g/L of methanesulfonic acid, 10 g/L of PEG20000, and 0.2 g/L of distearyldimethylammonium chloride. For lastly forming the In plating film used was an In plating solution containing indium sulfamate in an amount of 50 g/L as indium, 50 g/L of sulfamic acid, 100 g/L of sodium sulfamate, 10 g/L of sodium chloride, and 3 g/L of triethanolamine. Then these plating films were melted to form an In—Bi alloy bump. The In—Bi alloy bump was analyzed by using the EDX. In particular, the alloy bump was subjected to EDX mapping, and then measured was the composition ratio of In to Bi in each of the under layer region, the middle layer region, and the upper layer region, which were equally divided three regions in the bump. The following Table 4 shows the results.

TABLE 4

| Region | In | Bi |
| --- | --- | --- |
| Upper layer region | 83.4% by mass | 16.6% by mass |
| Middle layer region | 82.3% by mass | 17.7% by mass |
| Under layer region | 85.3% by mass | 14.7% by mass |
| All region | 83.3% by mass | 16.7% by mass |

From Tables 2 to 4, the following can be understood with respect to plural metal component contained in each alloy plating which was formed by the method for manufacturing an alloy bump according to the present invention. That is, it can be understood that there is little difference in the content ratio of the metal components among the under layer region, the middle layer region, and the upper layer region. Each metal component is homogeneously distributed to each region.

As mentioned above, an alloy bump having homogeneous composition can be conveniently obtained by the method for manufacturing an alloy bump according to the present invention.

DESCRIPTION OF THE REFERENCE CHARACTERS 10, 20 Substrate
11, 21 Under-bump metal (UBM)
12, 22 Resist pattern
13, 23 Openings
14 Sn plating film (First plating film)
15 In plating film (Second plating film)
16 In—Sn alloy bump
24 Sn plating film (First plating film)
25 Bi plating film (Second plating film)
26 Sn plating film (Third plating film)
27 Bi—Sn alloy bump

The invention claimed is:
1. A method for manufacturing an alloy bump, comprising:
  forming a resist pattern on a substrate, the resist pattern having openings which expose the substrate;
  forming an under-bump metal on the substrate inside the openings;
  forming a first plating film on the under-bump metal by electroplating;
  forming a second plating film on the first plating film by electroplating, the second plating film containing no metal components which are contained in the first plating film;
  removing the resist pattern;
  forming the alloy bump by heat treating the substrate to thereby alloy the first plating film and the second plating film; and
  forming a third plating film on the second plating film by electroplating after forming of the second plating film,
  wherein the forming of the third plating film is performed using the same metal as the first plating film, and
  wherein:
  the first plating film comprises Sn,
  the second plating film comprises Bi,
  the third plating film comprises Sn, and
  the forming of the alloy bump is performed without forming any further metal films on the third plating film.
2. The method for manufacturing an alloy bump according to claim 1, wherein the forming of the third plating film is performed so as to provide the third plating film with a smaller film thickness than the first plating film and the second plating film.
3. A method for manufacturing an alloy bump, comprising:
  forming a resist pattern on a substrate, the resist pattern having openings which expose the substrate;
  forming an under-bump metal on the substrate inside the openings;
  forming a first plating film on the under-bump metal by electroplating;
  forming a second plating film on the first plating film by electroplating, the second plating film containing no metal components which are contained in the first plating film;
  removing the resist pattern; and
  forming the alloy bump by heat treating the substrate to thereby alloy the first plating film and the second plating film,
  wherein:
  the first plating film comprises Sn,
  the second plating film comprises In, and
  the forming of the alloy bump is performed without forming any further metal films on the second plating film.

* * * * *